(12) United States Patent
Feng et al.

(10) Patent No.: US 8,940,608 B2
(45) Date of Patent: Jan. 27, 2015

(54) METHODS FOR FABRICATING INTEGRATED CIRCUITS WITH DRIFT REGIONS AND REPLACEMENT GATES

(75) Inventors: Jia Feng, San Jose, CA (US); Kuldeep Amarnath, San Jose, CA (US); Kevin J. Yang, Santa Clara, CA (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/529,898

(22) Filed: Jun. 21, 2012

(65) Prior Publication Data

US 2013/0344669 A1 Dec. 26, 2013

(51) Int. Cl.
*H01L 21/336* (2006.01)

(52) U.S. Cl.
USPC .................................. 438/286; 257/E21.417

(58) Field of Classification Search
CPC .............. H01L 21/336; H01L 21/3205; H01L 29/7801; H01L 29/66659; H01L 29/0847
USPC .................................................. 438/286, 183
See application file for complete search history.

(56) References Cited

U.S. PATENT DOCUMENTS

| | | | | |
|---|---|---|---|---|
| 7,776,700 B2 * | 8/2010 | Yang et al. | ..................... | 438/286 |
| 8,338,872 B2 * | 12/2012 | Khemka et al. | ............... | 257/299 |
| 2008/0182394 A1 * | 7/2008 | Yang et al. | ..................... | 438/510 |
| 2008/0242033 A1 * | 10/2008 | Levin et al. | .................... | 438/286 |
| 2008/0315308 A1 * | 12/2008 | Huang et al. | .................. | 257/343 |
| 2010/0237416 A1 * | 9/2010 | Hebert | .......................... | 257/343 |
| 2010/0315159 A1 * | 12/2010 | Kocon et al. | .................. | 327/564 |
| 2011/0108917 A1 * | 5/2011 | Shima | ........................... | 257/344 |
| 2011/0193161 A1 * | 8/2011 | Zhu et al. | ...................... | 257/343 |
| 2012/0068237 A1 * | 3/2012 | Booth, Jr. et al. | ............. | 257/296 |

* cited by examiner

*Primary Examiner* — Kimberly Rizkallah
*Assistant Examiner* — Mounir Amer
(74) *Attorney, Agent, or Firm* — Ingrassia Fisher & Lorenz, P.C.

(57) ABSTRACT

Methods for fabricating integrated circuits are provided. In an embodiment, a method for fabricating an integrated circuit includes providing a semiconductor substrate including a first region of a first doping type, a second region of the first doping type spaced from the first region, a drift region of the first doping type positioned between the first region and the second region, and regions of the opposite doping type. A mask covering both the drift region and the regions of the opposite doping type is formed. Then, a source/drain ion implantation is performed into the first region and the second region. The mask prevents the drift region and the regions of the opposite doping type from receiving the source/drain ion implantation.

18 Claims, 5 Drawing Sheets

METHODS FOR FABRICATING INTEGRATED CIRCUITS WITH DRIFT REGIONS AND REPLACEMENT GATES

TECHNICAL FIELD

The present disclosure generally relates to methods for fabricating integrated circuits, and more particularly relates to methods for fabricating integrated circuits having drift regions and replacement gates.

BACKGROUND

For high-power and radiofrequency applications, semiconductor products are often fabricated using drain-extended metal-oxide-semiconductor (DEMOS) transistor devices. DEMOS devices advantageously combine short-channel operation with high current handling capabilities, relatively low drain-to-source on-state resistance, and the ability to withstand high blocking voltages without suffering voltage breakdown failure (high breakdown voltage ratings).

DEMOS devices utilize a drift region between the channel under the gate and a region, such as the drain. The drift region ensures a significant portion of the drain-source voltage drops and, hence, prevents the channel from overheating and causing damage to the device.

Conventional fabrication processes typically require deposition of a blocking layer over drift regions in order to prevent the drift regions from receiving source/drain ion implantation. Further, the blocking layer inhibits silicidation of the drift regions during later silicidation processes. However, when used with replacement gate processes, the blocking layer hinders the removal of the temporary or dummy gate structures. Further, the deposition and patterning of the blocking layer itself can unnecessarily increase manufacturing costs and lengthen the manufacturing process.

Accordingly, it is desirable to provide methods for fabricating integrated circuits utilizing replacement gate structures and drift regions without blocking layers. In addition, it is desirable to provide methods for fabricating integrated circuits which use photoresist to protect drift regions from ion implantation. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In accordance with one embodiment, a method for fabricating an integrated circuit includes providing a semiconductor substrate including a first region of a first doping type, a second region of the first doping type spaced from the first region, a drift region of the first doping type positioned between the first region and the second region, and regions of the opposite doping type. A mask covering both the drift region and the regions of the opposite doping type is formed. Then, a source/drain ion implantation is performed into the first region and the second region. The mask prevents the drift region and the regions of the opposite doping type from receiving the source/drain ion implantation.

In another embodiment, a method for fabricating an integrated circuit includes providing a semiconductor substrate including a temporary gate structure having a first side and a second side, a first region spaced from the first side of the temporary gate structure, a drift region positioned between the first region and the first side of the temporary gate structure, and a second region proximate the second side of the temporary gate structure. A photoresist mask is formed over the drift region. Further, an ion implantation is performed into the first region and the second region. During the ion implantation, the photoresist mask prevents the drift region from receiving the ion implantation.

In accordance with another embodiment, a method for fabricating an integrated circuit includes providing a semiconductor substrate including a temporary gate structure, a first region of a first doping type spaced from the temporary gate structure, a drift region of the first doping type positioned between the first region and the temporary gate structure, a second region of the first doping type proximate the temporary gate structure opposite the drift region, and at least one region of the second doping type. The drift region and the at least one region of the second doping type are simultaneously masked. Then, an ion implantation is performed into the first region and the second region.

BRIEF DESCRIPTION OF THE DRAWINGS

Embodiments of methods for fabricating integrated circuits having drift regions and replacement gates will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits with drift regions and replacement gate structures are provided. Problems with conventional processes for forming replacement gate structures over semiconductor substrates formed with drift regions may be reduced through the use of a mask that is deposited and removed in existing process steps. Specifically, photoresist used to mask regions of one doping type during ion implantation of regions of the other doping type may also be used to mask drift regions. Removal of the photoresist occurs in typical steps before temporary gate structures are removed in the replacement gate process for formation of a high-k and metal gate. Therefore, additional steps are not needed to remove a protective layer over the drift regions. In later steps, an insulating dielectric material may be applied over drift regions and replacement gates before siliciding regions. Depositing the insulating dielectric material is also an existing process step.

FIGS. 1-9 illustrate sequentially a method for fabricating integrated circuits in accordance with various embodiments herein. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
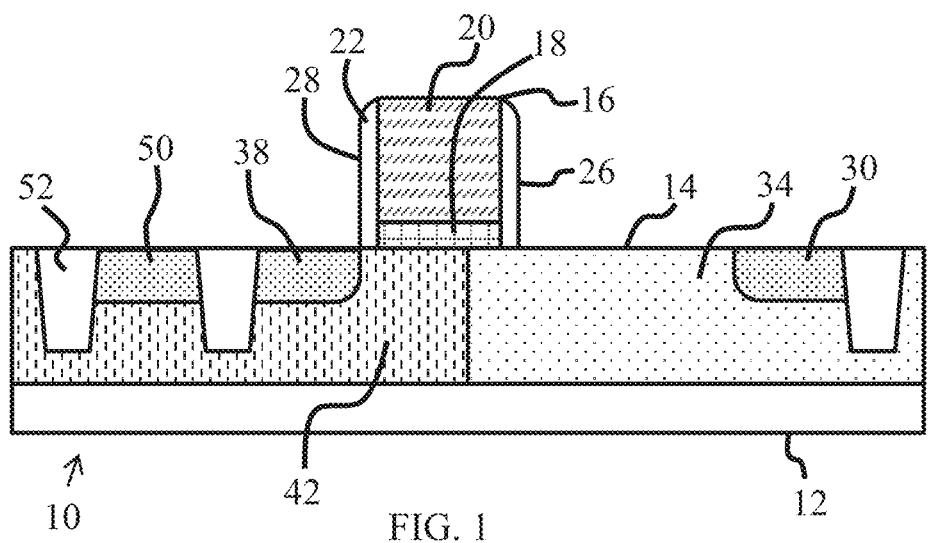
FIGS. 1-9 illustrate, in cross section, a portion of an integrated circuit and method steps for fabricating an integrated circuit in accordance with various embodiments herein.

In FIG. 1, in an exemplary embodiment, the process of fabricating an integrated circuit 10 begins by providing a semiconductor substrate 12 with a surface 14 on which a temporary gate structure 16 has been formed. As shown, the temporary gate structure 16 includes a temporary gate oxide 18, such as silicon dioxide, and a temporary gate material 20, such as polysilicon, and is bounded by a spacer 22. The temporary gate structure 16 has a first side 26 and a second side 28.

A first region 30 of a first doping type, e.g., an N-type drain, is formed in the semiconductor substrate 12 and is spaced from the first side 26 of the temporary gate structure 16. Further, a drift region 34 of the first doping type, e.g., an N-type drift region, is positioned between the first region 30 and the temporary gate structure 16. A second region 38 of the first doping type, e.g., an N-type source, is proximate the second side 28 of the temporary gate structure 16. As shown, the second region 38 is formed over a body 42 of a second doping type, e.g., a P-type body that abuts the drift region 34 below the gate structure 16. The second region 38 may be positioned adjacent the temporary gate structure 16, as shown, or spaced from the temporary gate structure 16. As further shown in FIG. 1, a region 50 of the opposite or second doping type, e.g., a P-type body contact, is also formed in the semiconductor substrate 12. The various regions are isolated by shallow trench isolation (STI) regions 52.

Figure 2:
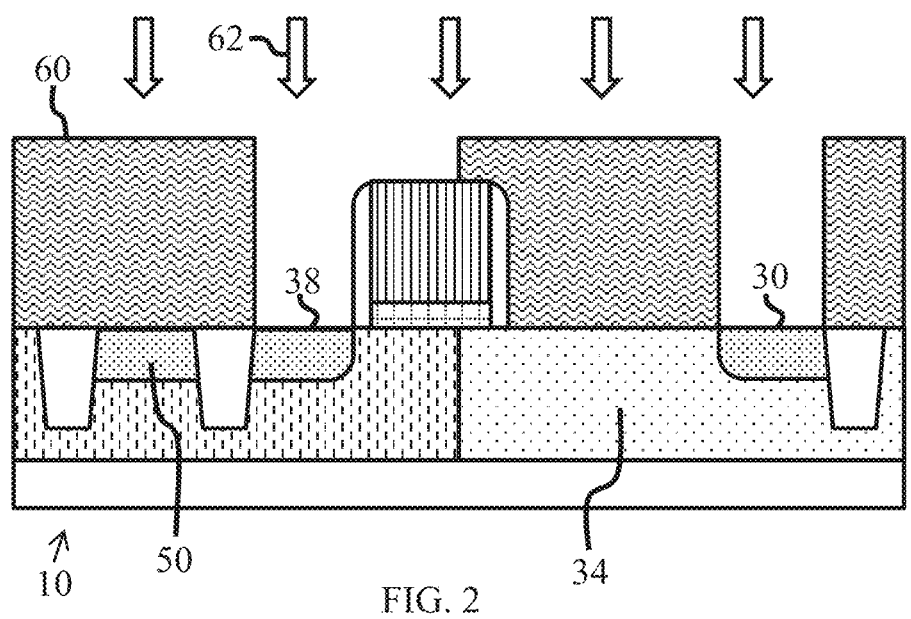

After formation of the partially processed integrated circuit 10 of FIG. 1, the integrated circuit 10 is prepared for an ion implantation step. As shown in FIG. 2, a photoresist layer 60 is simultaneously deposited to cover the drift region 34 and regions 50 of the second doping type. More specifically, the photoresist layer 60 is deposited and is patterned by typical photolithography steps to expose regions 30 and 38 while masking the drift region 34 and regions 50. Thereafter, the first region 30 and the second region 38 are doped to a high concentration by implanting ions 62 of the first doping type.

Figure 3:
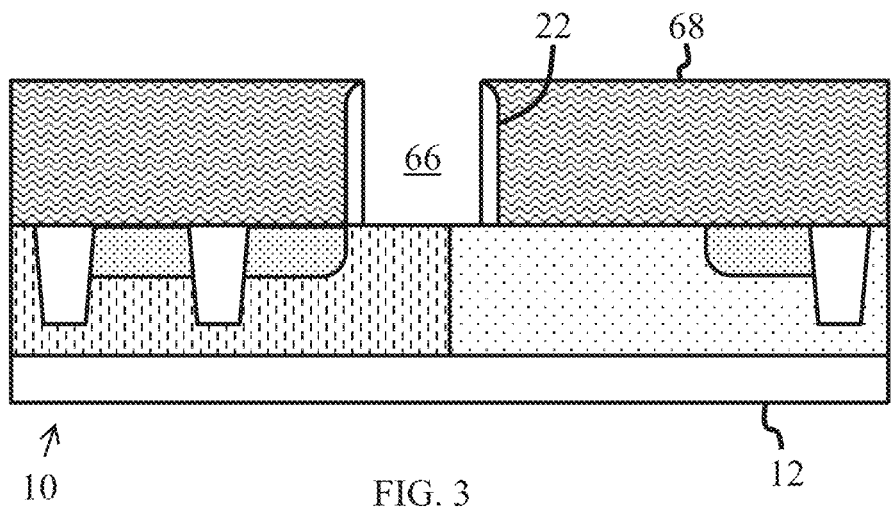

In FIG. 3, the photoresist 60 is removed, for example by treating the partially processed integrated circuit 10 with oxidizing chemicals such as ozone and sulfuric acid. An insulating dielectric layer 68, such as oxide, is then deposited and planarized to expose the top of the temporary gate structure 16. Then, the temporary gate material 20 is removed and the temporary gate oxide 18 is completely or partially removed. The removal of the temporary gate material 20 and the temporary gate oxide 18 creates a gate trench 66 over the semiconductor substrate 12 and between the spacers 22.

Figure 4:
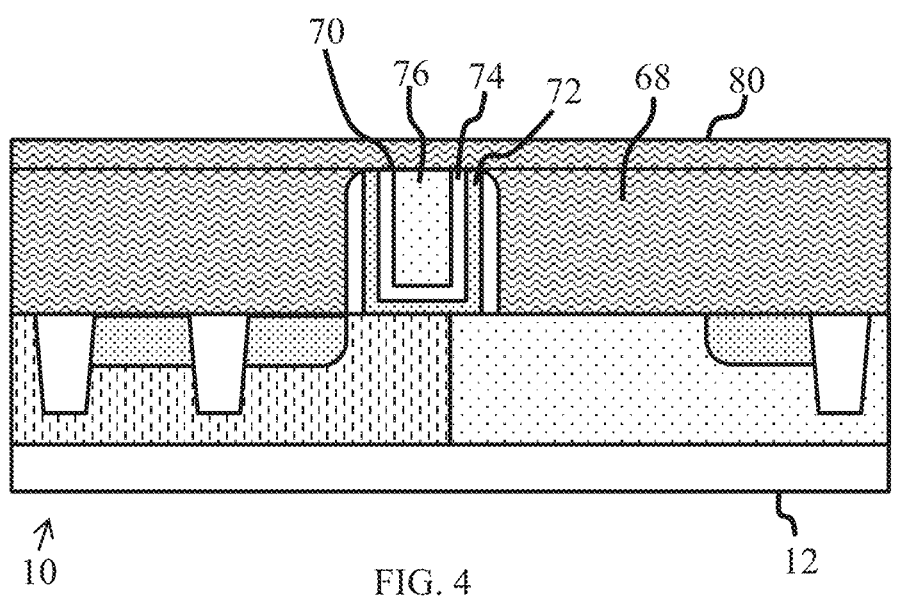

As shown in FIG. 4, a replacement gate structure 70 is formed in the gate trench 66. Specifically, several layers 72, 74, 76 may be deposited over layer 68 and into gate trench 66, and then planarized to layer 68 to form the replacement gate structure 70. The layer 72 may be a gate oxide and include multiple layers of dielectric materials including but not limited to hafnium oxide, hafnium silicon oxide, zirconium oxide, zirconium silicon oxide, lanthanum oxide, or similar dielectric materials. The layers 74, 76 may include metals including without limitation aluminum, titanium, titanium nitride, platinum, platinum compounds, tungsten, and tungsten compounds. Some of the metal layers may be used to tune the threshold voltage of the device and are called workfunction metals. An insulating dielectric layer 80 is also deposited over layer 68 and the replacement gate structure 70. The layer 80 may be silicon oxide, silicon oxide, any other dielectric, or any combination of dielectrics. The layer 80 can be used to induce strain to enhance device performance.

Figure 5:
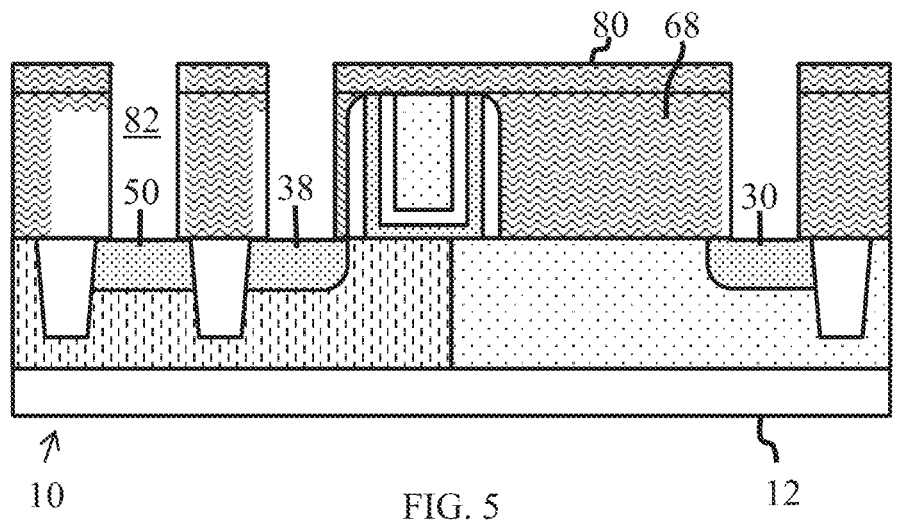
Figure 6:
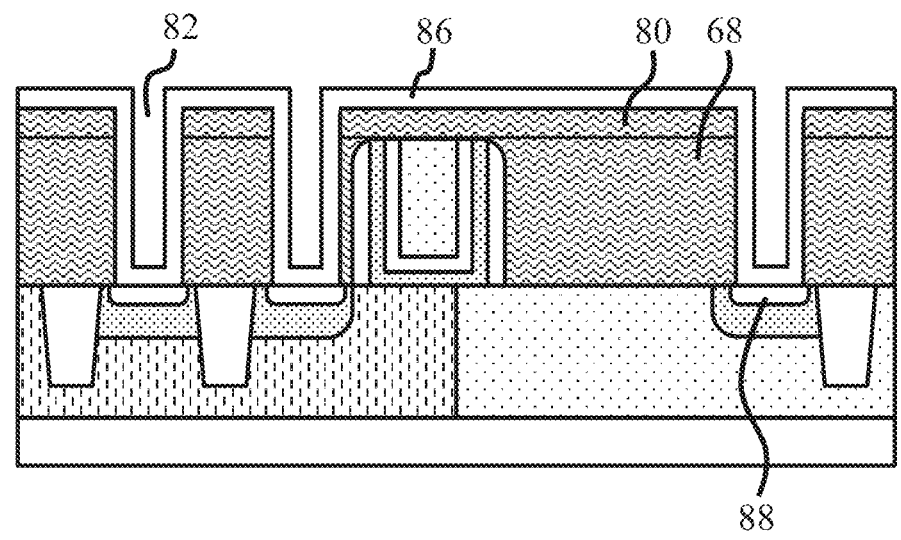

In FIG. 5, trenches 82 are etched or otherwise formed in layers 80 and 68 to expose the first region 30, the second region 38, and selected regions 50. As shown in FIG. 6, one or several layers of silicidation metals 86 are deposited over the layer 80 and into the trenches 82. The metal or metals 86 on the exposed regions 30, 38, 50 react with the silicon material to form silicide 88 which provides for low resistivity electrical contact. The metals 86 that may be used in the silicidation process include without limitation titanium, nickel, cobalt, tungsten, platinum, alloys thereof, and other known silicidation metals. During the silicidation process, layers 68 and 80 inhibit silicidation of the drift region 34.

Figure 7:
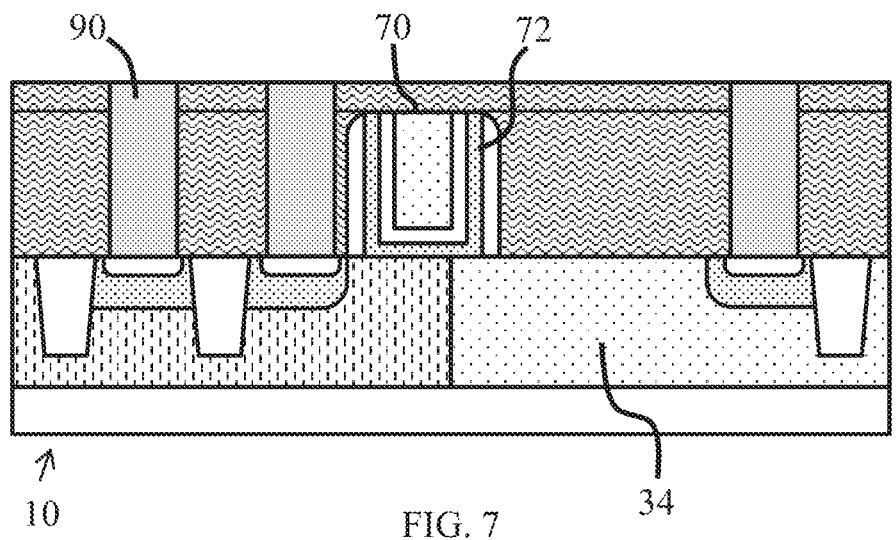

As is known, after silicidation the unreacted metals 86 can be selectively removed and the trenches 82 filled with metals to form metal contacts 90 as shown in FIG. 7. The metal contacts 90 may be formed with metals including without limitation titanium nitride, titanium, tungsten, alloys thereof, or a combination of several layers of such metals. The integrated circuit 10 of FIG. 7 may include a replacement gate structure 70 having a length in the range of about 0.01 microns to about 10 microns, a drift region 34 having a length in the range of about 0.01 microns to about 10 microns, and a gate oxide 72 having a thickness in the range of about 0.1 nm to about 100 nm.

Figure 8:
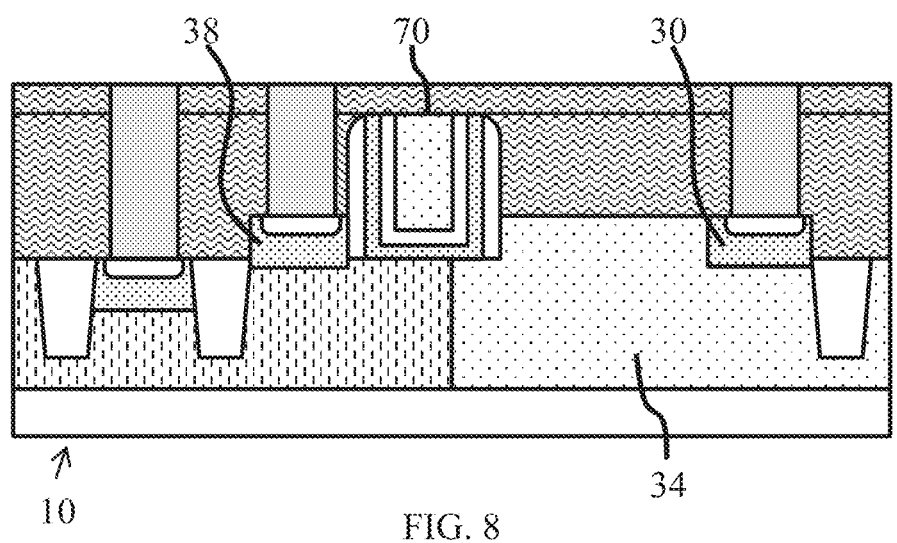

FIG. 8 depicts an alternate embodiment of the integrated circuit 10 which includes a raised first region 30, a raised drift region 34, and a raised second region 38. Such an embodiment may provide better device performance. In the method for forming the integrated circuit 10 of FIG. 8, the first region 30, drift region 34 and second region 38 are exposed to epitaxial growth of a material so that their surfaces are above the channel region below the gate structure 70. With the source and drain raised, the series resistance may be reduced and the device can withstand more loss of silicon during the trench steps of the silicide process. The materials that may be epitaxially grown include without limitation silicon, germanium, silicon germanium, and silicon carbide.

Figure 9:
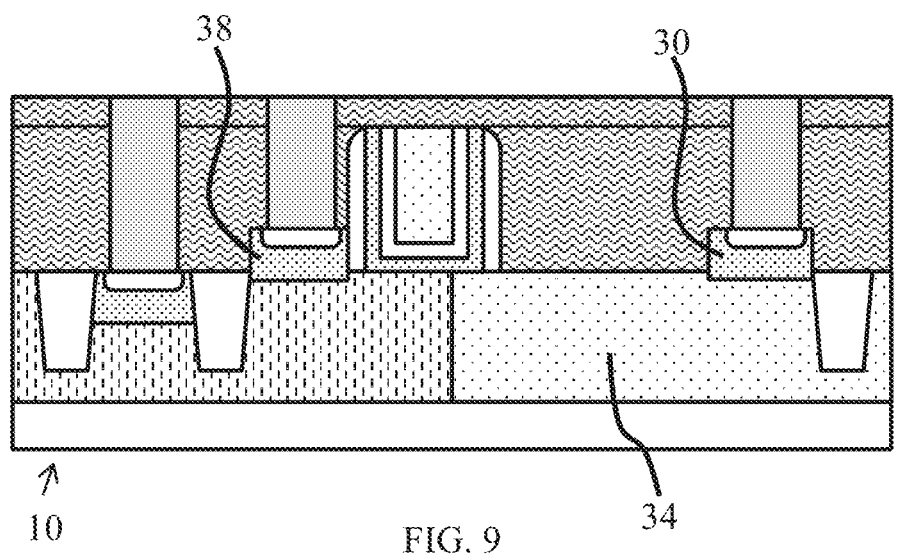

FIG. 9 depicts another alternate embodiment of the integrated circuit 10. In FIG. 9, the first region 30 and the second region 38 are raised while the drift region 34 is not. This structure may be realized by covering the drift region 34 with a mask or blocking layer, such as silicon oxide, silicon nitride, or other materials or combination of materials, during the epitaxial growth process. To avoid increases in manufacturing costs, the drift region 34 may be covered by the hardmask used for covering regions of the second doping type when regions of the first doping type undergo epitaxial growth.

It is understood herein that the first doping type may be N-type or P-type and that the corresponding second doping type is P-type or N-type, respectively. Further, the first region 30 may be a drain or source and the second region 38 may be the corresponding source or drain.

As described above, fabrication processes are implemented to form integrated circuits with drift regions and replacement gate structures. Problems with conventional processes for forming integrated circuits with drift regions and replacement gate structures may be reduced through the use of existing photoresist deposition, patterning, and removal processes to protect the drift regions during source/drain ion implantation, i.e., photoresist for protecting regions of the other doping type can be used to simultaneously protect the drift regions. Further, existing dielectric deposition and etching processes may be used to protect the drift regions during silicidation of regions, i.e., dielectric used to protect silicon surfaces not to be silicided can also be used to protect the drift regions.

To briefly summarize, the fabrication methods described herein result in simplified processes and reduced manufacturing costs. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for manufacturing an integrated circuit comprising:
    providing a semiconductor substrate having an upper surface formed by a drift region of a first doping type, a first region of the first doping type formed in the drift region, a third region of the opposite doping type, a second region of the first doping type formed in the third region, an isolation region formed in the third region adjacent the second region, and a temporary gate structure between the drift region and the second region;
    applying a layer of photoresist to the upper surface formed by the first region, the second region, the drift region, and the third region;
    etching the layer of photoresist to form a mask covering the upper surface formed by the drift region and the third region;
    performing a source/drain ion implantation into the first region and the second region, wherein the mask prevents the upper surface formed by the drift region and the upper surface formed by the third region from receiving the source/drain ion implantation;
    removing the mask and exposing the upper surface formed by the drift region and the third region;
    after removing the mask, removing the temporary gate structure and defining a gate trench;
    forming a replacement gate structure in the gate trench;
    depositing an insulating dielectric layer over the replacement gate structure and semiconductor substrate;
    forming trenches in the insulating dielectric layer to expose the first region and the second region; and
    siliciding the exposed regions.

2. The method of claim 1 wherein a first segment of the upper surface is formed by the first region, a drift segment of the upper surface is formed by the drift region, and a second segment of the upper surface is formed by the second region, and wherein the drift segment is positioned between the first segment and the second segment.

3. The method of claim 1 wherein:
    providing the semiconductor substrate comprises providing the semiconductor substrate with the temporary gate structure over the upper surface and overlying a gate-underlying section of the semiconductor substrate bounded by a first section of the semiconductor substrate and a second section of the semiconductor substrate;
    the drift region and the third region meet at an interface; and
    the interface is positioned completely within the gate-underlying section of the semiconductor substrate.

4. The method of claim 1 further comprising:
    after removing the mask, depositing a first insulating dielectric layer over the temporary gate structure and semiconductor substrate; and
    depositing a second insulating dielectric layer over the replacement gate structure and first insulating dielectric layer.

5. The method of claim 1 wherein providing a semiconductor substrate comprises epitaxially growing material on the semiconductor substrate to form a raised portion of the first region and a raised portion of the second region, wherein each raised portion has a raised surface above the upper surface of the semiconductor substrate.

6. The method of claim 1 wherein providing the semiconductor substrate comprises providing the semiconductor substrate with the temporary gate structure over the upper surface and overlying a gate-underlying section of the semiconductor substrate, and wherein the second region formed in the third region is bounded by the isolation region and the gate-underlying section.

7. A method for manufacturing an integrated circuit comprising:
    providing a semiconductor substrate including a temporary gate structure having a first side and a second side, a first region of a first doping type spaced from the first side of the temporary gate structure, a drift region of the first doping type at least partially positioned between the first region and the first side of the temporary gate structure, a second region of the first doping type proximate the second side of the temporary gate structure, and a third region of an opposite doping type;
    forming a photoresist mask directly on the drift region and the third region by depositing a layer of photoresist over the temporary gate structure, the first region, the second region, the drift region and the third region and etching the layer of photoresist overlying the first region and the second region;
    performing an ion implantation into the first region and the second region, wherein the photoresist mask prevents the drift region and the third region from receiving the ion implantation;
    removing the photoresist mask;
    removing the temporary gate structure and defining a gate trench;
    forming a replacement gate structure in the gate trench;
    depositing an insulating dielectric layer over the replacement gate structure and semiconductor substrate;
    forming trenches in the insulating dielectric layer to expose the first region and the second region; and
    siliciding the exposed regions.

8. The method of claim 7 wherein the third region includes a first portion and a second portion, wherein the temporary gate structure and the second region are formed over the first portion of the third region, and wherein forming a photoresist mask directly on the drift region and the third region comprises depositing the layer of photoresist directly on the temporary gate structure, the first region, the second region, the drift region and the third region.

9. The method of claim 7 wherein a substrate surface is partially formed by a portion of the drift region and a portion of the third region, wherein the photoresist is formed directly on the substrate surface partially formed by the portion of the drift region and the portion of the third region.

10. The method of claim 7 wherein providing a semiconductor substrate comprises providing a semiconductor substrate having an isolation region formed in the third region, wherein the second region is bounded by the isolation region and the second side of the temporary gate structure.

11. The method of claim 7 wherein providing a semiconductor substrate comprises epitaxially growing material on the semiconductor substrate to form a raised portion of the first region and a raised portion of the second region, wherein each raised portion has a raised surface above the upper surface of the semiconductor substrate.

12. The method of claim 11 wherein providing a semiconductor substrate comprises epitaxially growing material on the semiconductor substrate to form a raised portion of the drift region, wherein the raised portion of the drift region has a raised surface above the upper surface of the semiconductor substrate.

13. A method for manufacturing an integrated circuit comprising:
providing a semiconductor substrate including a temporary gate structure formed thereon, wherein the temporary gate structure lies over a gate-underlying section of the semiconductor substrate bounded by a first section of the semiconductor substrate and a second section of the semiconductor substrate, wherein the semiconductor substrate includes a first region of a first doping type formed in the first section and spaced from the gate-underlying section, a drift region of the first doping type positioned adjacent the first region and having a first portion formed in the first section and a gate-underlying portion formed in the gate-underlying section, a second region of the first doping type formed in the second section, and a third region of the second doping type including a gate-underlying portion formed in the gate-underlying section and a second portion formed in the second section, wherein the drift region does not extend into the second section and the second region does not extend into the first section;
simultaneously applying a layer of photoresist over the first region, the first portion of drift region, the second region and the second portion of the third region, and etching the layer of photoresist to form a mask over the first portion of the drift region and the second portion of the third region; and
performing an ion implantation into the first region and the second region;
unmasking the first portion of the drift region and the second portion of the third region;
removing the temporary gate structure and defining a gate trench;
forming a replacement gate structure in the gate trench;
depositing an insulating dielectric layer over the replacement gate structure and semiconductor substrate;
forming trenches in the insulating dielectric layer to expose the first region and the second region; and
siliciding the exposed regions.

14. The method of claim 13 wherein the first portion of the drift region and the second portion of the third region partially form a surface of the semiconductor substrate, and wherein simultaneously applying a layer of photoresist over the first region, the first portion of the drift region, the second region and the second portion of the third region comprises simultaneously applying a layer of photoresist directly on the first region, the first portion of the drift region, the second region and the second portion of the third region.

15. The method of claim 13 wherein forming trenches in the insulating dielectric layer comprises exposing the first region, the second region, and the third region; and wherein siliciding the exposed regions comprises siliciding the first region, second region, and the third region.

16. The method of claim 13 wherein providing a semiconductor substrate comprises epitaxially growing material on the semiconductor substrate to form a raised portion of the first region and a raised portion of the second region, wherein each raised portion has a raised surface above an upper surface of the semiconductor substrate.

17. The method of claim 16 wherein providing a semiconductor substrate comprises epitaxially growing material on the semiconductor substrate to form a raised portion of the drift region, wherein the raised portion of the drift region has a raised surface above an upper surface of the semiconductor substrate.

18. The method of claim 13 wherein providing a semiconductor substrate comprises providing a semiconductor substrate having an isolation region formed in the second section, wherein the second region is formed in the second section and is bounded by the isolation region and the gate-underlying section.

* * * * *